(12) United States Patent
Mayer-Dick

(10) Patent No.: US 10,631,399 B2
(45) Date of Patent: Apr. 21, 2020

(54) ELECTRONIC MODULE

(71) Applicant: CONTINENTAL AUTOMOTIVE GMBH, Hannover (DE)

(72) Inventor: Anton Mayer-Dick, Regensburg (DE)

(73) Assignee: Continental Automotive GmbH, Hannover (GB)

( * ) Notice: Subject to any disclaimer, the term of this patent is extended or adjusted under 35 U.S.C. 154(b) by 0 days.

(21) Appl. No.: 16/193,067

(22) Filed: Nov. 16, 2018

(65) Prior Publication Data

US 2019/0150272 A1 May 16, 2019

(30) Foreign Application Priority Data

Nov. 16, 2017 (DE) .................... 10 2017 220 417

(51) Int. Cl.
| | |
|---|---|
| *H05K 1/00* | (2006.01) |
| *H05K 1/02* | (2006.01) |
| *H05K 7/00* | (2006.01) |
| *H01L 23/34* | (2006.01) |
| *H01L 23/48* | (2006.01) |
| *H01L 23/495* | (2006.01) |
| *H05K 1/18* | (2006.01) |

(52) U.S. Cl.
CPC ......... *H05K 1/0218* (2013.01); *H05K 1/0206* (2013.01); *H05K 1/181* (2013.01); *H05K 1/0259* (2013.01); *H05K 2201/066* (2013.01); *H05K 2201/0715* (2013.01); *H05K 2201/0723* (2013.01); *H05K 2201/0959* (2013.01); *H05K 2201/10166* (2013.01)

(58) Field of Classification Search
CPC ... H05K 1/00; H05K 1/02; H05K 7/00; H01L 23/34; H01L 23/48; H01L 23/495
USPC ........ 361/719, 707, 709, 749; 174/252, 262; 257/690, 692
See application file for complete search history.

(56) References Cited

U.S. PATENT DOCUMENTS

| | | | |
|---|---|---|---|
| 9,107,290 B1 * | 8/2015 | Chen .................... | H05K 3/0061 |
| 10,182,494 B1 * | 1/2019 | Jacobbson ............. | H05K 1/021 |
| 2001/0045644 A1 * | 11/2001 | Huang ................ | H01L 23/4334 |
| | | | 257/718 |
| 2006/0017529 A1 * | 1/2006 | Cooper .................. | H01P 3/088 |
| | | | 333/238 |
| 2006/0019505 A1 * | 1/2006 | Cooper ............... | B32B 37/0015 |
| | | | 439/55 |
| 2006/0145328 A1 * | 7/2006 | Hsu ..................... | H01L 23/5389 |
| | | | 257/690 |

(Continued)

*Primary Examiner* — Xiaoliang Chen
(74) *Attorney, Agent, or Firm* — Laurence A. Greenberg; Werner H. Stemer; Ralph E. Locher

(57) ABSTRACT

An electronic module with reduced electromagnetic interference radiation includes a multilayer printed circuit board having an electrically conductive outer layer and at least one electrically conductive inner layer, an electronic component, a heat sink and a plurality of thermal plated-through holes. The electronic component is disposed on and electrically connected to the outer layer. The heat sink is thermally connected to the multilayer printed circuit board by an electrical insulation layer. Heat generated during operation of the electronic component can be dissipated to the heat sink through the plurality of thermal plated-through holes. The plurality of thermal plated-through holes do not have an electrical connection to the outer layer.

9 Claims, 1 Drawing Sheet

(56) References Cited

U.S. PATENT DOCUMENTS

| | | | |
|---|---|---|---|
| 2007/0176298 A1* | 8/2007 | Osone | H01L 23/3121 257/777 |
| 2008/0315396 A1* | 12/2008 | Kuhlman | H01L 23/3121 257/692 |
| 2009/0002950 A1* | 1/2009 | Gertiser | H05K 1/0206 361/709 |
| 2009/0260858 A1* | 10/2009 | Nakai | H05K 1/0206 174/252 |
| 2012/0126388 A1* | 5/2012 | Lin | H01L 21/56 257/690 |
| 2012/0129298 A1* | 5/2012 | Lin | H01L 25/16 438/118 |
| 2014/0268594 A1* | 9/2014 | Wang | H05K 1/183 361/749 |
| 2015/0255380 A1* | 9/2015 | Chen | H01L 23/49568 361/707 |
| 2016/0057854 A1* | 2/2016 | Schneider | B32B 9/007 174/252 |

* cited by examiner

ELECTRONIC MODULE

CROSS-REFERENCE TO RELATED APPLICATION

This application claims the priority, under 35 U.S.C. § 119, of German Patent Application DE 10 2017 220 417.6, filed Nov. 16, 2017; the prior application is herewith incorporated by reference in its entirety.

BACKGROUND OF THE INVENTION

Field of the Invention

The invention relates to an electronic module having a multilayer printed circuit board, an electronic component and a heat sink.

Electronic modules have the problem of being able to dissipate the heat arising during operation of an electronic component to a heat sink through the printed circuit board. The heat sink generally is formed of a metal for the purpose of good heat dissipation. For the purpose of heat conduction, thermal plated-through holes (vias) are provided in the printed circuit board, which constitutes a thermal resistance, and extend, below the electronic component to be cooled, from the latter in the direction of the heat sink. Thermal plated-through holes are holes which pass through the printed circuit board and are filled with thermally conductive material, generally copper. The thermal plated-through holes generally do not contribute to the signal routing, but rather are used exclusively to conduct heat. In order to ensure electrical insulation between the heat sink and the printed circuit board, an electrical insulation layer is provided between the heat sink and the printed circuit board. That electrical insulation layer is very thin in order to achieve a thermal resistance which is as low as possible.

The electrical insulation layer is a (parasitic) small electrical capacitance, the size of which depends on the thickness, the size of the area and the material being used. Higher-frequency electromagnetic radiation can be transmitted to the heat sink (for example a metal housing in which the electronic module is disposed) through this parasitic capacitance and can be emitted from there. The level or intensity of the electromagnetic radiation is dependent on the quality or reliability of the grounding of the metal housing, for example in a vehicle.

It would be desirable to already be able to suppress or reduce the generation of electromagnetic radiation due to the structure of the electronic module irrespective of the quality of the subsequent electrical connection of the electronic module in a metal housing and/or the installation of the electronic module with a customer.

SUMMARY OF THE INVENTION

It is accordingly an object of the invention to provide an electronic module, which overcomes the hereinafore-mentioned disadvantages of the heretofore-known devices of this general type and which is functionally and/or structurally improved in such a way that the risk of electromagnetic interference radiation is reduced or eliminated.

With the foregoing and other objects in view there is provided, in accordance with the invention, an electronic module which comprises a multilayer printed circuit board, an electronic component, a heat sink, and a plurality of thermal plated-through holes. The multilayer printed circuit board includes an electrically conductive outer layer and at least one electrically conductive inner layer. The electronic component is disposed on the outer layer and is electrically connected to the latter. The heat sink is thermally connected to the multilayer printed circuit board though an electrical insulation layer. The heat generated during operation of the electronic component can be dissipated to the heat sink through the plurality of thermal plated-through holes. In this case, the plurality of thermal plated-through holes do not have an electrical connection to the outer layer.

In the electronic module according to the invention, electrical isolation is effected between the electrically conductive outer layer, on which the electronic component is disposed, and the thermal plated-through holes on a top side of the multilayer printed circuit board. This makes it possible to reduce or avoid electromagnetic interference radiation through the heat sink or a metal housing to which the electronic module is connected.

It is expedient if the plurality of thermal plated-through holes include a first group of plated-through holes disposed outside a surface of the outer layer in a sectional view. In particular, the plurality of plated-through holes in the first group of plated-through holes can extend to a boundary surface of an insulation layer on which the outer layer is disposed. In other words, the outer layer of the multilayer printed circuit board is not formed over the entire surface of the printed circuit board, but rather spares at least that region of the printed circuit board in which the first group of plated-through holes are provided. The outer layer "structured" in this manner can be effected by using a subtractive or additive method when producing the printed circuit board.

According to another configuration, the plurality of thermal plated-through holes includes a second group of plated-through holes disposed below the outer layer in a sectional view. In this configuration, provision may be made for the outer layer to have a recess in the region of the thermal plated-through holes in the second group of plated-through holes. This avoids electrical contact between the outer layer and the plated-through holes in the second group of plated-through holes. The recess in the outer layer can be produced by using an additive or subtractive method when producing the printed circuit board.

Provision may also be made for the free ends of the plurality of plated-through holes in the first group of plated-through holes and/or the plurality of plated-through holes in the second group of plated-through holes on or below the boundary surface of the insulation layer, on which the outer layer is disposed, to be covered with an insulation material, in particular a solder resist. This ensures that there is no electrical contact between the outer layer and the thermal plated-through holes if the outer layer leads beyond the plated-through holes in the second group of plated-through holes, that is to say does not have a recess in this region. Electromagnetic interference radiation can be reduced or avoided by avoiding electrical contact between the outer layer and the plated-through holes in the second group of plated-through holes.

Another expedient configuration provides for at least some of the plurality of thermal plated-through holes to be electrically connected to the at least one inner layer and/or to a further outer layer respectively having a reference potential. As a result of the fact that the thermal plated-through holes, which are used exclusively to transfer heat, are connected to a reference potential (for example a ground potential), higher-frequency interference radiation can be greatly attenuated due to a capacitive transition from the outer layer to the first inner layer. A good distribution of heat over the width of the printed circuit board is also ensured.

It is also expedient if at least some of the plurality of thermal plated-through holes are electrically connected at least to the inner layer which is closest to the outer layer. This ensures a good distribution of heat over the width of the printed circuit board by using the thermal plated-through holes which are electrically and therefore thermally connected to one another. In particular, this makes it possible to already distribute the heat immediately below the electronic component, wherein that inner layer which is closest to the outer layer is involved first in the transfer of heat, rather than the outer layer.

In summary, the invention is based on the consideration that two electrically insulated layers of a printed circuit board constitute an electrical capacitance with respect to one another. High-frequency oscillations can therefore be capacitively transmitted from one electrically insulated layer to another electrically conductive layer. Known devices attempt to keep the capacitive value of the electrical insulation layer very small in order to reduce the capacitive transmission to the heat sink. However, that usually results in a deterioration in the transfer of heat from the electrical insulation layer to the heat sink. The capacitive transmission of high-frequency oscillations between the outer layer and the inner layer can be greatly attenuated by connecting at least one of the layers, which are electrically connected to the thermal plated-through holes, to reference potential, for example ground. This virtually short-circuits the transmission of the high-frequency oscillation to the housing. In the proposed configuration, the transfer of heat from the electrical insulation layer to the heat sink can therefore be optimized.

Other features which are considered as characteristic for the invention are set forth in the appended claims.

Although the invention is illustrated and described herein as embodied in an electronic module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
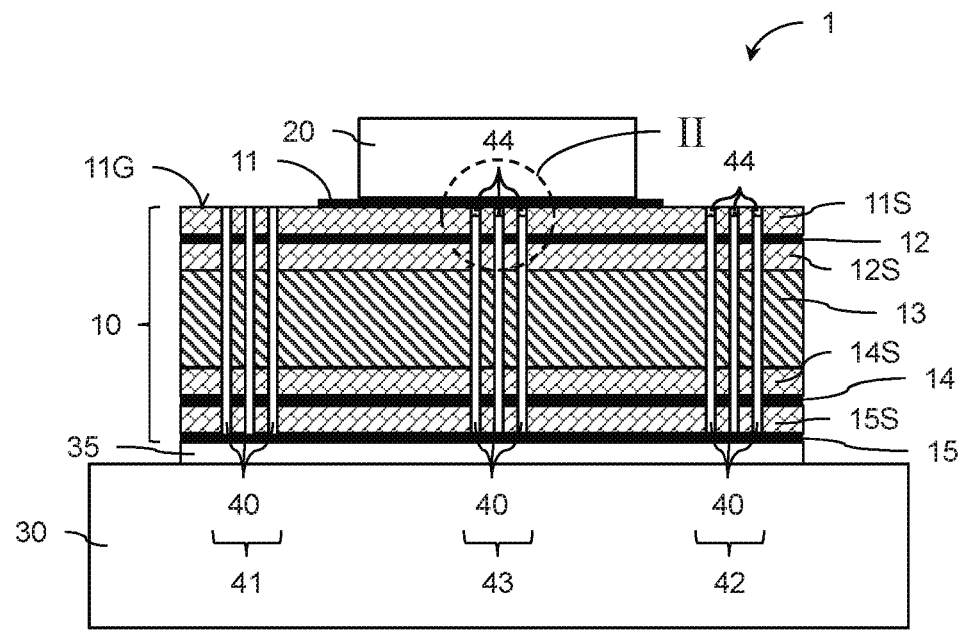
FIG. 1 is a diagrammatic, cross-sectional view of an electronic module according to the invention.

Referring now to the figures of the drawings in detail and first, particularly, to FIG. 1 thereof, there is seen a cross-sectional illustration of an electronic module 1 according to the invention. The electronic module 1 includes a multilayer printed circuit board 10. In the present exemplary embodiment, the printed circuit board 10 is in the form of a four-layer printed circuit board, that is to say the printed circuit board 10 includes four electrically conductive layers. The number of layers may also be greater than four.

The printed circuit board 10 includes a printed circuit board core 13, in such a way that electrically conductive layers are respectively provided on both sides of the printed circuit board core 13. The printed circuit board 10 includes, from top to bottom, a (structured) outer layer 11, an insulation layer 11S of the outer layer 11, a (structured) inner layer 12 (first inner layer or inner layer closest to the outer layer 11), an insulation layer 12S of the outer layer 12, the printed circuit board core 13, an insulation layer 14S, a (structured) inner layer 14, an insulation layer 15S of an outer layer 15, and the (structured) outer layer 15. The production of such a multilayer printed circuit board is sufficiently well known to a person skilled in the art, and therefore a detailed description of the production process is dispensed with at this juncture.

An electronic component 20, for example a power semiconductor switching module or element, is disposed on a surface of the outer layer 11. The electronic component 20 is electrically connected to the outer layer 11, for example by soldering. The outer layer 11 is generally part of an electrical circuit of the electronic module 1. The outer layer 11 occupies a smaller area than the area of the insulation layer 11S below it. This can be effected by using a subtractive or additive method, for example, for applying the outer layer 11 to the insulation layer. The corresponding methods are sufficiently well known to a person skilled in the art, and therefore a detailed description is dispensed with.

The printed circuit board 10 is connected to the other (further) outer layer 15 by an electrical insulation layer 35 having a heat sink 30. The heat sink 30 constitutes, for example, a cooling area or a housing component that undertakes the function of a heat sink and is formed from a material with good thermal conductivity, for example metal. The electrical insulation layer 35, also referred to as the TIM (Thermal Insulating Member), is so thin that there is a sufficiently good transfer of heat from the printed circuit board 10 to the heat sink 30.

The heat generated during operation of the electronic component 20 is dissipated to the heat sink 30 through a plurality of thermal plated-through holes 40. The provision of the number and/or the configuration of thermal plated-through holes 40 takes into account the fact that the printed circuit board core 13, in particular, has a comparatively high thermal resistance which hinders the dissipation of heat in the direction of the outer layer 15 and to the heat sink 30 in a disruptive manner.

In the present exemplary embodiment, the plurality of thermal plated-through holes 40 have been subdivided into two groups for the purposes of illustration. In a practical implementation, it is sufficient if only one of the groups (that is to say either the first group or the second group) of plated-through holes 40 is provided. By way of example, two first groups 41, 42 of plated-through holes 40 are disposed outside the surface of the outer layer 11 in the sectional view shown in FIG. 1. Due to this configuration, the plated-through holes 40 in the first group 41, 42 do not have an electrical connection to the outer layer 11.

The plated-through holes 40 in the first group 41 differ from the plated-through holes 40 in the first group 42 in that the plated-through holes 40 in the first group 41 extend to a boundary surface 11G of the insulation layer 11S on which the outer layer 11 is disposed. Since the outer layer 11 does not slip over the free ends of the plated-through holes 40 and therefore does not have any electrical contact with the plated-through holes 40 in the first group 41 which project at the boundary surface 11G of the insulation layer 11S, no separate insulation measures need to be taken.

In contrast, the free ends of the plated-through holes 40 in the first group 42 are not guided to the boundary surface 11G of the insulation layer 11S. Rather, they are covered with an insulation material 44, for example a solder resist, below (or alternatively: on) the boundary surface 11G. This procedure is also provided for the plated-through holes 40 in a second group 43 of plated-through holes disposed below the outer layer 11 in the sectional view according to FIG. 1.

Figure 2:
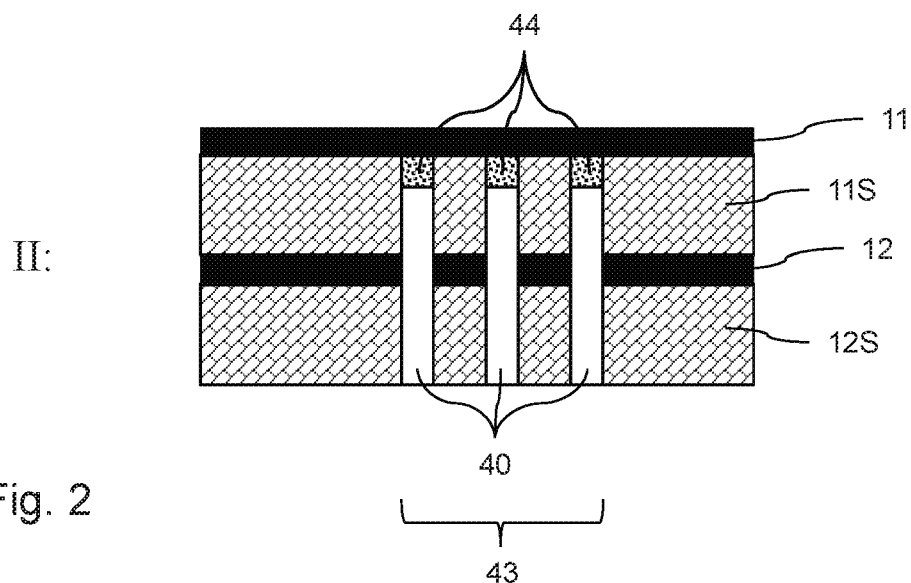
FIG. 2 is an enlarged view of a region indicated with reference sign II in FIG. 1.

This situation is illustrated in an enlarged manner in FIG. 2, in which case FIG. 2 illustrates the region indicated with reference sign II in FIG. 1. It can be clearly seen from this illustration that the plated-through holes 40 in the second group 43 do not project to the boundary surface 11G, but rather a region formed between the boundary surface 11G and the free ends of the plated-through holes 40 is filled by the insulation material 44.

The plated-through holes 40 in the first group 41, 42 and/or the plated-through holes in the second group 43 are electrically connected at least to the inner layer 12 closest to the outer layer 11. The plated-through holes 40 in the first group 41, 42 and/or the plated-through holes in the second group 43 are optionally also electrically connected to the inner layer 14 and/or the outer layer 15. The inner layer 12 and optionally the inner layer 14 and/or the outer layer 15 have a reference potential.

As a result of the electrical connection at least between an inner layer 12, 14 of the printed circuit board 10 and the outer layer 15 adjacent the heat sink 30, heat can be distributed in the width direction (that is to say from left to right in the plane of the page).

It is clear to a person skilled in the art that the expression "the inner layer 12 and/or the inner layer 14 and/or the outer layer 15 has/have a reference potential" should not be understood as meaning that a reference potential is only applied to the inner layers 12 and/or 14. Rather, corresponding conductor trace structures of the respective inner layer 12 and/or 14 are connected to a reference potential, for example ground potential, wherein these conductor trace structures then have an electrical connection to the plating of the thermal plated-through holes 40. Other voltage potentials can be applied to other parts of the conductor trace structures for the purpose of conducting signals.

In the proposed electronic module, the outer layer 11, which includes a large fastening area (solder area) for the electronic component 20, does not have a direct electrical and thermal connection to thermal plated-through holes in the direction of the heat sink 30. Heat is transferred through the thin insulation layer 11S of the outer layer 11. The inner layer 12 closest to the outer layer 11 is directly connected to a reference potential. The thermal plated-through holes 40 electrically and thus thermally connected to this inner layer 12 then transfer the heat from the inner layer 12 in the direction of the heat sink 30, wherein heat is transferred in a known manner from the electrical insulation layer 35 to the heat sink 30.

As described, the thermal resistance can be reduced by virtue of the plated-through holes 40 being electrically connected not only to the inner layer 12 but also to the further inner layer 14 and optionally the outer layer 15, in which case these (or corresponding conductor trace structures) are then connected to reference potential.

In principle, the electronic module 1 can be configured in such a manner that only plated-through holes 40 in the first group 41 or 42 of plated-through holes are provided. The dissipation of heat is improved further by additionally providing the thermal plated-through holes 40 in the second group 43.

As a result of the fact that an electrical insulation layer is effected on that side of the printed circuit board 10 to which the electronic component 20 is applied (the so-called populating side), electromagnetic interference radiation can be reduced by the heat sink 30. In particular, existing higher-frequency radiation is already greatly attenuated.

The described implementation additionally improves the ESD sensitivity. If an ESD pulse is discharged to the metal housing constituting the heat sink, the high peak voltage (energy) is greatly reduced by the double barrier (insulated transition from the metal housing to the printed circuit board and insulated transition from the printed circuit board to the component(s)) and a risk or damage to the component(s) is therefore avoided.

The invention claimed is:

1. An electronic module, comprising:
   a multilayer printed circuit board having an electrically conductive outer layer and at least one electrically conductive inner layer;
   an electronic component disposed on and electrically connected to said outer layer;
   a heat sink and an electrical insulation layer thermally connecting said multilayer printed circuit board to said heat sink;
   a plurality of thermal plated-through holes for dissipating heat generated during operation of said electronic component to said heat sink, said plurality of thermal plated-through holes not having an electrical connection to said outer layer; and
   said plurality of thermal plated-through holes includes a first group of plated-through holes disposed below said outer layer in a cross-section of the electronic module.

2. The electronic module according to claim 1, wherein said plurality of thermal plated-through holes includes a second group of plated-through holes disposed outside a surface of said outer layer in a cross-section of the electronic module.

3. The electronic module according to claim 2, which further comprises:
   an insulation layer on which said outer layer is disposed, said insulation layer having a boundary surface; and
   said plurality of plated-through holes in said second group of plated-through holes extending to said boundary surface of said insulation layer.

4. The electronic module according to claim 1, wherein said outer layer has a recess in a region of said plurality of thermal plated-through holes in said first group of plated-through holes.

5. The electronic module according to claim 1, which further comprises:
   an insulation material covering free ends of said plurality of plated-through holes in at least one of said first or second groups of plated-through holes;
   said insulation material being disposed on or below said boundary surface of said insulation layer on which said outer layer is disposed.

6. The electronic module according to claim 5, wherein said insulation material is a solder resist.

7. The electronic module according to claim 1, which further comprises:
   a further outer layer having a reference potential;
   at least some of said plurality of thermal plated-through holes being electrically connected to at least one of said at least one inner layer or said further outer layer.

8. The electronic module according to claim 1, wherein:
   said at least one inner layer includes a plurality of inner layers;

one of said plurality of inner layers is closest to said outer layer; and at least some of said plurality of thermal plated-through holes are electrically connected at least to said inner layer being closest to said outer layer.

9. An electronic module, comprising:

a multilayer printed circuit board having an electrically conductive outer layer and at least one electrically conductive inner layer;

an electronic component disposed on and electrically connected to said outer layer;

a heat sink and an electrical insulation layer thermally connecting said multilayer printed circuit board to said heat sink;

a plurality of thermal plated-through holes for dissipating heat generated during operation of said electronic component to said heat sink, said plurality of thermal plated-through holes not having an electrical connection to said outer layer;

an insulation material covering free ends of said plurality of thermal plated-through holes;

said insulation material being disposed on or below said boundary surface of said insulation layer on which said outer layer is disposed.

* * * * *